(12) United States Patent
Hsieh et al.

(10) Patent No.: US 11,782,303 B2
(45) Date of Patent: Oct. 10, 2023

(54) ELECTRONIC DEVICE AND MANUFACTURING METHOD WITH A PARTICULAR LIGHT SHIELDING STRUCTURE IN AN ICON REGION

(71) Applicant: Darwin Precisions Corporation, Hsinchu County (TW)

(72) Inventors: Yu-An Hsieh, Hsinchu County (TW); Chi-Chang Chen, Taoyuan County (TW); Chia-Hsin Chang, Miaoli County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 0 days.

(21) Appl. No.: 17/878,094

(22) Filed: Aug. 1, 2022

(65) Prior Publication Data

US 2023/0288746 A1 Sep. 14, 2023

(30) Foreign Application Priority Data

Mar. 14, 2022 (TW) .................................. 111109269

(51) Int. Cl.
*G02F 1/1335* (2006.01)
*H05K 1/18* (2006.01)
*G02F 1/1333* (2006.01)

(52) U.S. Cl.
CPC .... *G02F 1/133512* (2013.01); *G02F 1/13338* (2013.01); *G02F 1/133331* (2021.01); *G02F 1/133524* (2013.01); *H05K 1/189* (2013.01); *G02F 2202/28* (2013.01); *H05K 2201/10136* (2013.01)

(58) Field of Classification Search
CPC ......... G02F 1/133512; G02F 1/133331; G02F 1/13338; G02F 2202/28
See application file for complete search history.

(56) References Cited

U.S. PATENT DOCUMENTS

| | | | |
|---|---|---|---|
| 2014/0192279 A1* | 7/2014 | Akanuma | G02B 6/0075 349/12 |
| 2014/0340364 A1 | 11/2014 | Tang et al. | |
| 2019/0227597 A1* | 7/2019 | Kim | G06F 3/0488 |

FOREIGN PATENT DOCUMENTS

| | | |
|---|---|---|
| CN | 203217510 U | 9/2013 |
| CN | 103345316 A | 10/2013 |
| CN | 203720492 U | 7/2014 |
| TW | 201439642 A | 10/2014 |

* cited by examiner

*Primary Examiner* — Jessica M Merlin
(74) *Attorney, Agent, or Firm* — WPAT, P.C

(57) ABSTRACT

An electronic device includes a display module, a protection cover, a first light shielding layer, a light guide plate, a light source, a touch sensitive film, a first optical adhesive, a light shielding element, and a second light shielding layer. The first light shielding layer connects a bottom surface of the protection cover, and is configured to define a non-visible area of the electronic device. The light guide plate is located on the display module and overlaps the non-visible area. The light shielding element is located on the display module and overlaps the non-visible area. The second light shielding layer is located on the touch sensitive film and overlaps the light shielding element. The second light shielding layer is configured to absorb light transmitted in the touch sensitive film and the first optical adhesive in the non-visible area.

15 Claims, 7 Drawing Sheets

ELECTRONIC DEVICE AND MANUFACTURING METHOD WITH A PARTICULAR LIGHT SHIELDING STRUCTURE IN AN ICON REGION

RELATED APPLICATIONS

This application claims priority to Taiwan Application Ser. No. 111109269, filed Mar. 14, 2022, which is herein incorporated by reference.

BACKGROUND

Field of Invention

The present disclosure relates to an electronic device and a manufacturing method of the electronic device.

Description of Related Art

Touch display modules have been used in various types of electronic devices, such as smart phones, tablet computers, and digital cameras. Each of the aforementioned electronic devices may have a visible area of a screen and a non-visible area that surrounds the visible area. The non-visible area can have icons for users to touch to operate the electronic device.

However, in order to allow users to easily identify the position of the icon, a backlight module can be usually disposed below the icon. In addition to lighting up the icons, a light from the backlight module may also be transmitted laterally to the visible area of the screen through a touch-sensitive film and an optical adhesive that are above the backlight module, which results in light leakage in the visible area, thereby affecting product yield and product competitiveness, and causing unfavorable visual experience for users.

SUMMARY

One aspect of the present disclosure provides an electronic device.

According to some embodiments of the present disclosure, an electronic device includes a display module, a protection cover, a first light shielding layer, a light guide plate, a light source, a touch sensitive film, a first optical adhesive, a light shielding element, and a second light shielding layer. The protection cover is located above the display module. The first light shielding layer connects a bottom surface of the protection cover, and is configured to define a non-visible area of the electronic device. The light guide plate is located on the display module and overlaps the non-visible area. The light source is located on the display module and is adjacent to the light guide plate. The touch sensitive film is above the light guide plate. The first optical adhesive is located between the touch sensitive film and the protection cover. The light shielding element is located on the display module and overlaps the non-visible area. The second light shielding layer is located on the touch sensitive film and overlaps the light shielding element, and is configured to absorb light transmitted in the touch sensitive film and the first optical adhesive in the non-visible area.

In some embodiments, the second light shielding layer is located between the first optical adhesive and the touch sensitive film.

In some embodiments, the second light shielding layer is surrounded by the first optical adhesive, and is located between the first light shielding layer and the touch sensitive film.

In some embodiments, the electronic device further includes a third light shielding layer located in the non-visible area, wherein the touch sensitive film is located between the second light shielding layer and the third light shielding layer.

In some embodiments, the second light shielding layer and the third light shielding layer are respectively located on a top surface and a bottom surface of the touch sensitive film.

In some embodiments, the second light shielding layer at least partially overlaps the third light shielding layer.

In some embodiments, a top surface of the light shielding element abuts against the third light shielding layer.

In some embodiments, a width of the third light shielding layer is substantially the same as a width of the second light shielding layer.

In some embodiments, the light guide plate is located between the light shielding element and the light source.

In some embodiments, the first light shielding layer has an icon opening located above the light guide plate and configured to enable light of the light guide plate to pass through.

In some embodiments, the first optical adhesive is located between the first light shielding layer and the second light shielding layer.

In some embodiments, a top surface of the light shielding element is higher than a top surface of the light guide plate and a top surface of the light source.

In some embodiments, the electronic device further includes a flexible printed circuit board located on the display module, wherein the light shielding element, the light guide plate, and the light source are located on the flexible printed circuit board.

In some embodiments, the electronic device further includes a second optical adhesive located between the display module and the touch sensitive film, wherein the light shielding element is located between the second optical adhesive and the light guide plate.

In some embodiments, a width of the second light shielding layer is greater than a width of the light shielding element.

Another aspect of the present disclosure provides a manufacturing method of an electronic device.

According to some embodiments of the present disclosure, a manufacturing method of an electronic device includes forming a first light shielding layer on a protection cover; forming a first optical adhesive and a second light shielding layer on a touch sensitive film; adhering, by the first optical adhesive, the protection cover to the touch sensitive film, such that the first optical adhesive is located between the touch sensitive film and the protection cover; and adhering the touch sensitive film to a display module.

In the aforementioned embodiments of the present disclosure, since the second light shielding layer is located on the touch sensitive film and overlaps the light shielding element, when the light source emits light, the touch sensitive film and the first optical adhesive above the light guide plate would laterally transmit the light but the light would be absorbed by the second light shielding layer in the non-visible area such that the light would not transmit to the visible area of the electronic device. As a result, it can be ensured that the light of the light guide plate is passed through the icon opening of the first light shielding layer, and does not enter the visible area and cause the problem of light leakage in the visible area, which can improve the product yield and product competitiveness, and is beneficial to user's visual experience. Moreover, the second light shielding layer on the touch sensitive film does not affect the circuit design of the touch sensitive film.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
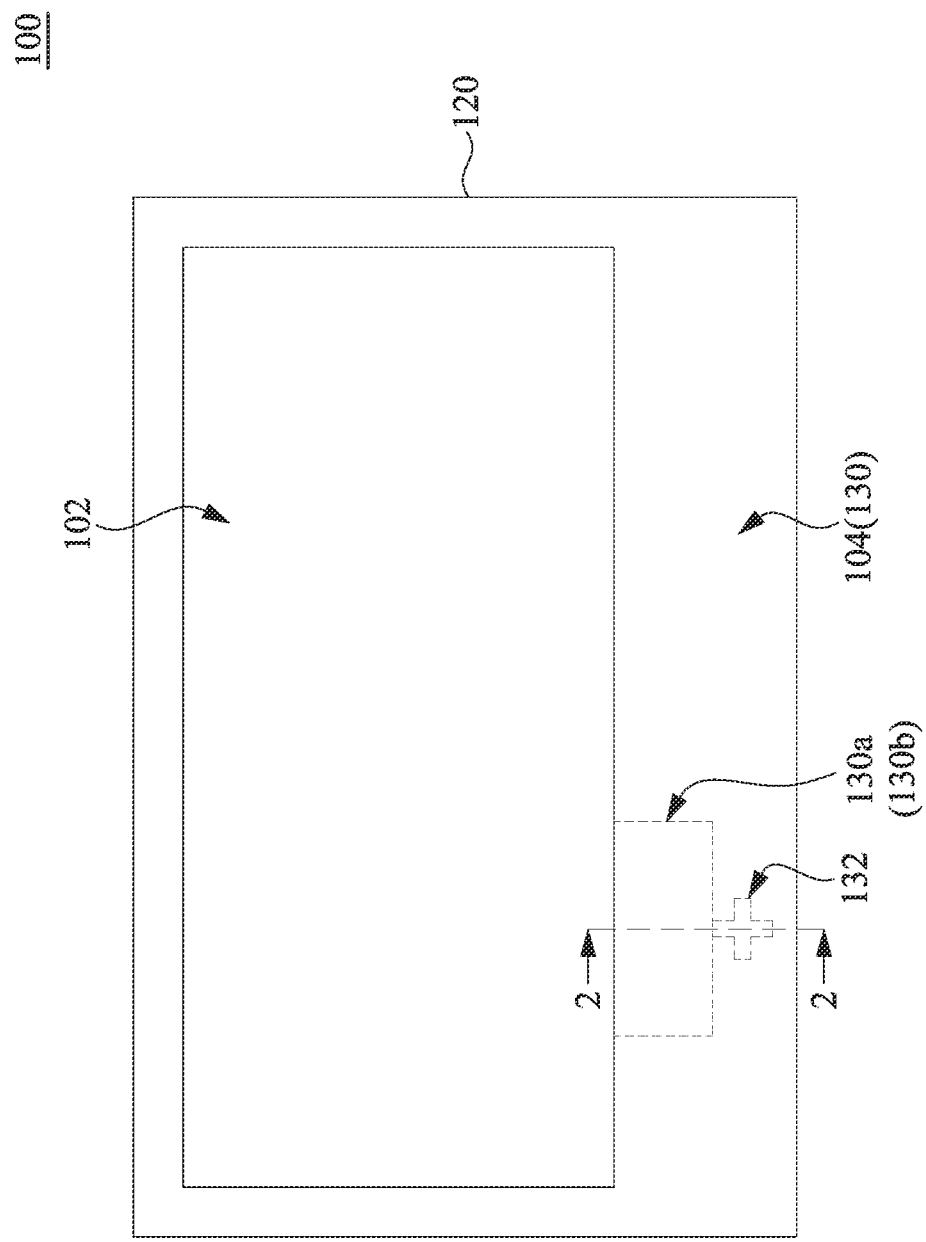
FIG. 1 is a top view of an electronic device according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
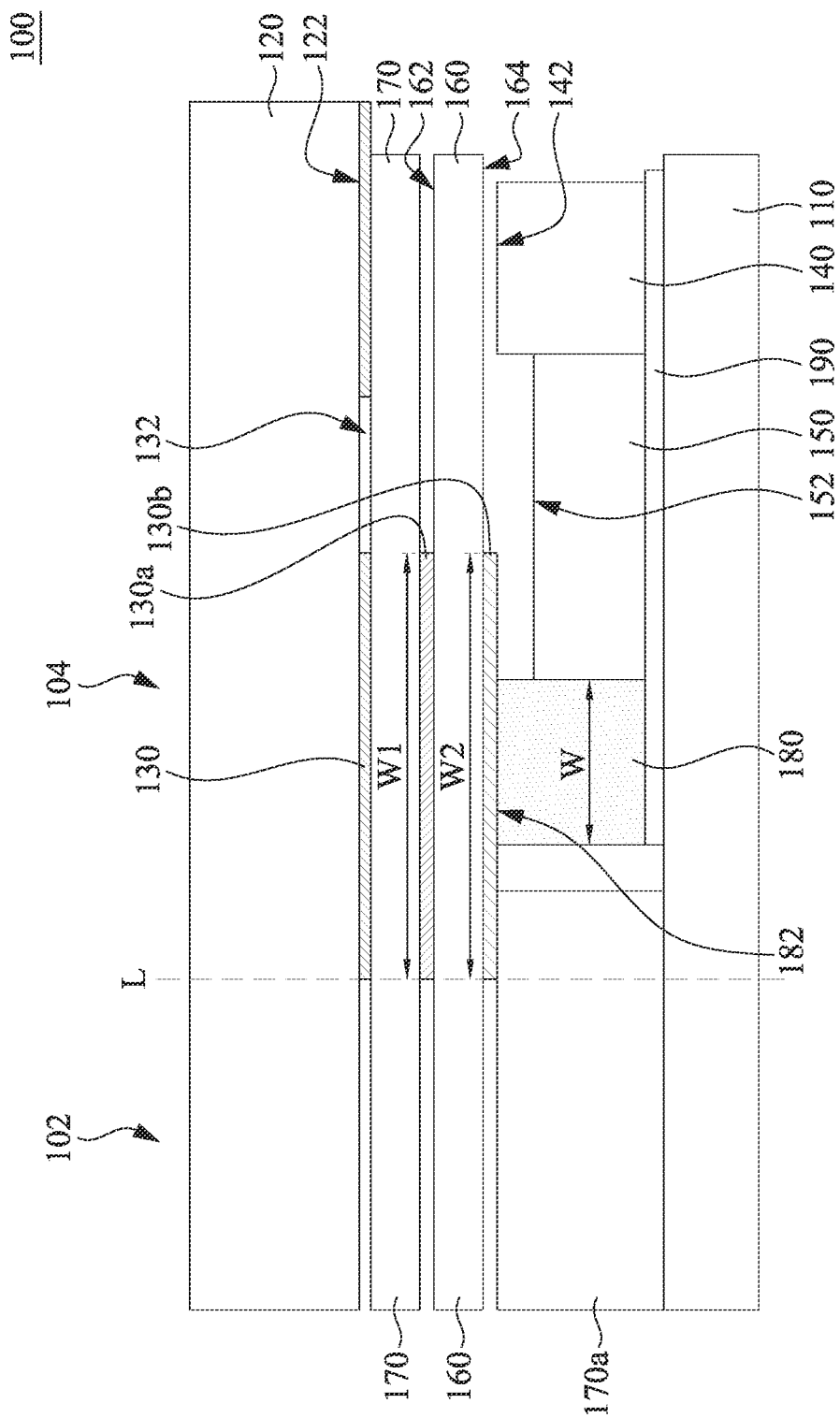
FIG. 2 is a cross-sectional view of the electronic device taken along line 2-2 of FIG. 1.

FIG. 1 is a top view of an electronic device 100 according to one embodiment of the present disclosure. FIG. 2 is a cross-sectional view of the electronic device 100 taken along line 2-2 of FIG. 1. As shown in FIG. 1 and FIG. 2, the electronic device 100 includes a display module 110, a protection cover 120, a first light shielding layer 130, a light source 140, a light guide plate 150, a touch sensitive film 160, a first optical adhesive 170, a light shielding element 180, and a second light shielding layer 130a. The protection cover 120 is located above the display module 110. The first light shielding layer 130 connects a bottom surface 122 of the protection cover 120. The first light shielding layer 130 is configured to define a non-visible area 104 of the electronic device 100, such as an area at the right side of the dotted line L in FIG. 2. In the description, the non-visible area 104 is referred to as an area overlapping the first light shielding layer 130. Moreover, the electronic device 100 has a visible area 102 surrounded by the non-visible area 104 to display images, such as an area at the left side of the dotted line L in FIG. 2. The light guide plate 150 is located on the display module 110 and overlaps the non-visible area 104. The light source 140 is located on the display module 110 and is adjacent to the light guide plate 150. The touch sensitive film 160 is above the light guide plate 150. The first optical adhesive 170 is located between the touch sensitive film 160 and the protection cover 120. The light shielding element 180 is located on the display module 110 and overlaps the non-visible area 104. The second light shielding layer 130a is located on the touch sensitive film 160 and overlaps the light shielding element 180. In this embodiment, the second light shielding layer 130a is located between the first optical adhesive 170 and the touch sensitive film 160, and can absorb light transmitted in the first optical adhesive 170 and the touch sensitive film 160.

Figure 3:
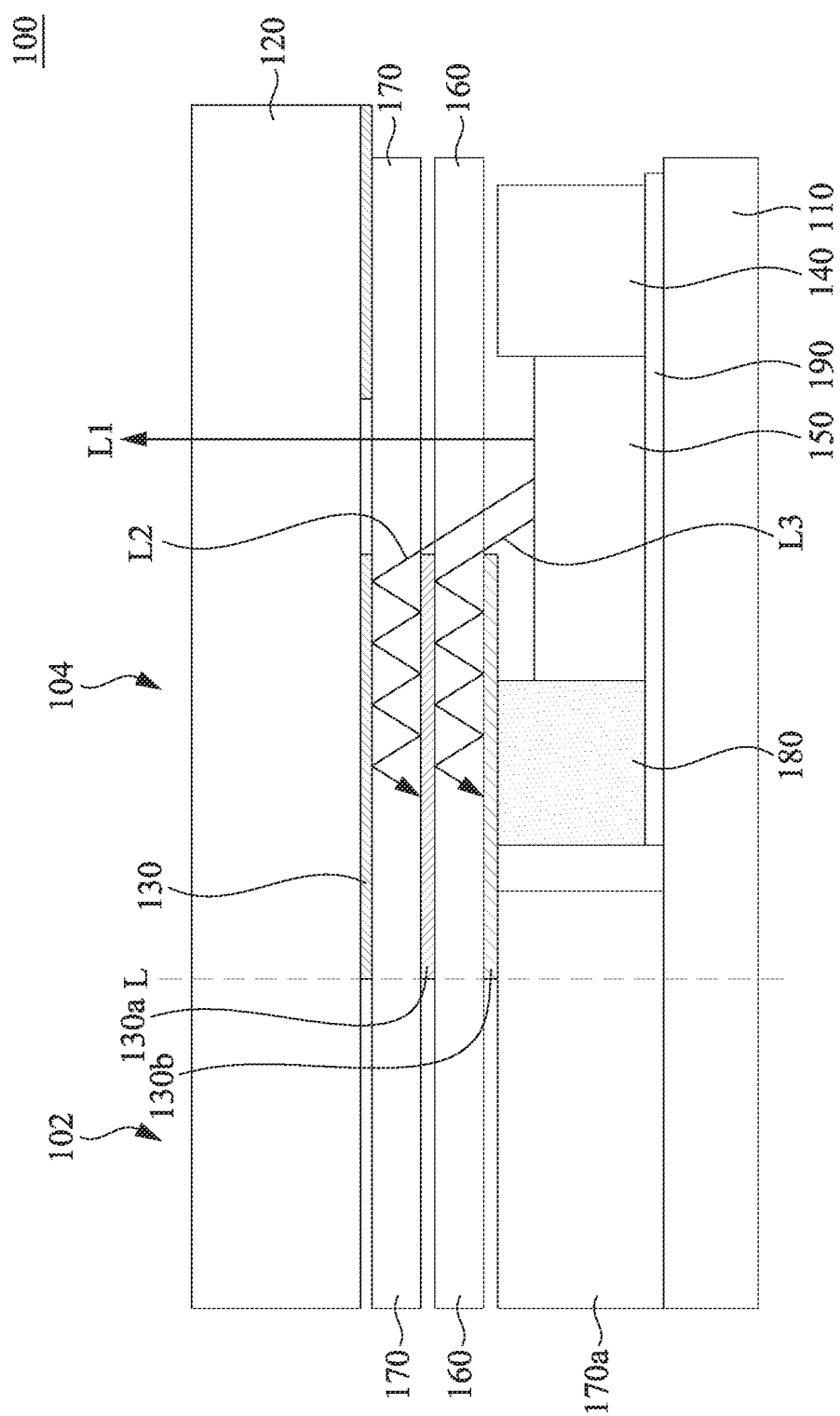
FIG. 3 is a schematic view of light paths when the electronic device of FIG. 2 is in use.

In addition, the first light shielding layer 130 has an icon opening 132. The icon opening 132 is located above the light guide plate 150 and may be pressed by users to enable the touch sensitive film 160 to transmit a corresponding signal to control the electronic device 100. In FIG. 1, the second light shielding layer 130a is located between the visible area 102 and the icon opening 132. FIG. 3 is a schematic view of light paths when the electronic device 100 of FIG. 2 is in use. As shown in FIG. 2 and FIG. 3, when the light source 140 emits light, the light guide plate 150 may receive the light of the light source 140 and irradiate the light outward from a light emitting surface (e.g., a top surface 152) of the light guide plate 150. The light guide plate 150 may emit upward light L1 and oblique light L2 and L3. The icon opening 132 of the first light shielding layer 130 may enable the light L1 of the light guide plate 150 to pass through, such that users outside the protection cover 120 can see the lighted icon opening 132. Furthermore, the first light shielding layer 130 and the second light shielding layer 130a may absorb the light L2 transmitted in the first optical adhesive 170 in the non-visible area 104, and the second light shielding layer 130a may further absorb the light L3 transmitted in the touch sensitive film 160.

Specifically, since the second light shielding layer 130a is located on the touch sensitive film 160 and overlaps the light shielding element 180, when the light source 140 emits light, the touch sensitive film 160 and the first optical adhesive 170 above the light guide plate 150 would laterally transmit the light L3 and L2 respectively, but the light L3 and L2 would be absorbed by the second light shielding layer 130a in the non-visible area 104 such that the light L3 and L2 would not transmit to the visible area 102 of the electronic device 100. As a result, it can be ensured that the light of the light guide plate 150 is passed through the icon opening 132 of the first light shielding layer 130, and does not enter the visible area 102 and cause the problem of light leakage in the visible area 102, which can improve the product yield and product competitiveness, and is beneficial to user's visual experience. Moreover, the second light shielding layer 130a on the touch sensitive film 160 does not affect the circuit design of the touch sensitive film 160.

In this embodiment, the electronic device 100 may further include a third light shielding layer 130b. The third light shielding layer 130b is located in the non-visible area 104, wherein the touch sensitive film 160 is located between the second light shielding layer 130a and the third light shielding layer 130b. The second light shielding layer 130a and the third light shielding layer 130b are respectively located on a top surface 162 and a bottom surface 164 of the touch sensitive film 160. When the light source 140 emits light, the third light shielding layer 130b may further absorb the light L3 transmitted in the touch sensitive film 160. In addition, a top surface 182 of the light shielding element 180 may abut against the third light shielding layer 130b to effectively prevent the light of the light guide plate 150 from being laterally transmitted into the visible area 102.

In this embodiment, the light source 140 may be a light emitting diode. The light shielding element 180 may be a light shielding foam, such as a black foam for blocking light and absorbing light. The display module 110 may be a liquid crystal display (LCD) module. The protection cover 120 may be a glass sheet. The first light shielding layer 130 may be black ink that is printed on the bottom surface 122 of the protection cover 120 to define the non-visible area 104 of the electronic device 100. The second light shielding layer 130a may be black ink that is printed on the touch sensitive film 160. The touch sensitive film 160 and the first optical adhesive 170 are transparent to allow light to pass through. The first optical adhesive 170 may be an optical clear adhesive (OCA). The present disclosure is not limited by the aforementioned materials. In other embodiments, different materials with similar functions can be selected according to design requirements. The electronic device 100 may be, but not limited to a smart phone, a tablet computer, or a digital camera.

In addition, the light guide plate 150 is located between the light shielding element 180 and the light source 140, which can ensure that light irradiating outward from the lateral surface of the light guide plate 150 does not enter the visible area 102. In this embodiment, the top surface 182 of the light shielding element 180 is higher than a top surface 152 of the light guide plate 150 and a top surface 142 of the light source 140, which can prevent light laterally transmitted to the visible area 102. The first optical adhesive 170 is located between the first light shielding layer 130 and the second light shielding layer 130a, and thus the second light shielding layer 130a is adhered by the first optical adhesive 170.

Furthermore, the electronic device 100 further includes a flexible printed circuit board 190. The flexible printed circuit board 190 is located on the display module 110, wherein the light shielding element 180, the light guide plate 150, and the light source 140 are located on the flexible printed circuit board 190. The flexible printed circuit board 190 is electrically connected to the light source 140 to provide power to the light source 140. In this embodiment, the electronic device 100 further includes a second optical adhesive 170a. The second optical adhesive 170a is located between the display module 110 and the touch sensitive film 160, and is configured to adhere the touch sensitive film 160 to the display module 110. The light shielding element 180 is located between the second optical adhesive 170a and the light guide plate 150, thereby prevent the light of the light guide plate 150 from being transmitted to the second optical adhesive 170a in the visible area 102 and causing light leakage.

As shown in FIG. 1 and FIG. 2, a width W1 of the second light shielding layer 130a is greater than a width W of the light shielding element 180, and thus the second light shielding layer 130a may extend to a position above the light guide plate 150 and adjacent to the icon opening 132, thereby improving light absorbing range. The second light shielding layer 130a at least partially overlaps the third light shielding layer 130b. In this embodiment, a width W2 of the third light shielding layer 130b is substantially the same as the width W1 of the second light shielding layer 130a.

Through the aforementioned configuration, the second light shielding layer 130a and the third light shielding layer 130b have the same contour.

It is to be noted that the connection relationships, the materials, and the advantages of the elements described above will not be repeated in the following description. In the following description, other types of electronic devices will be described.

Figure 4:
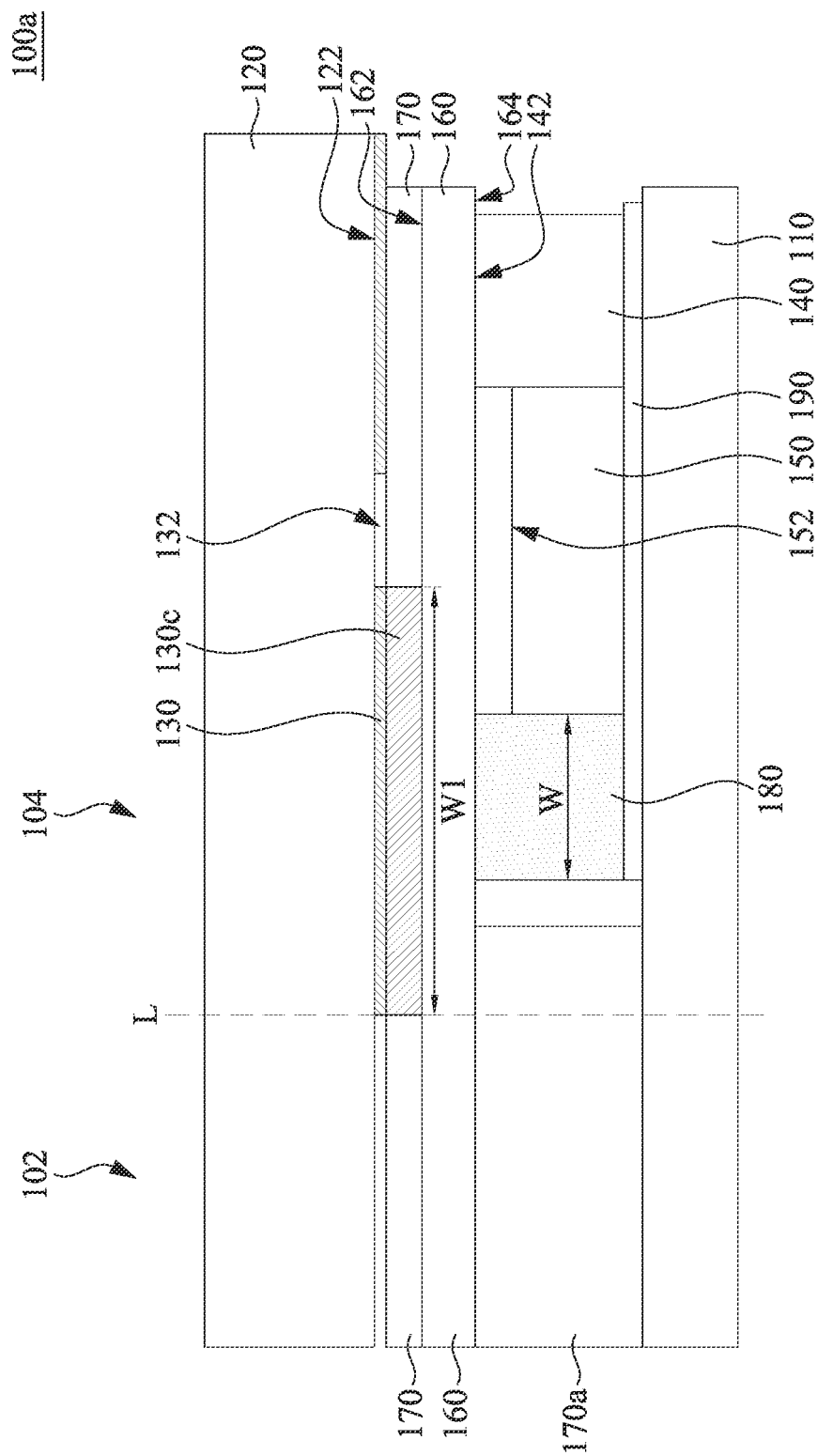
FIG. 4 is a cross-sectional view of an electronic device according to another embodiment of the present disclosure, in which the cross-sectional position of FIG. 4 is the same as that of FIG. 2.
Figure 5:
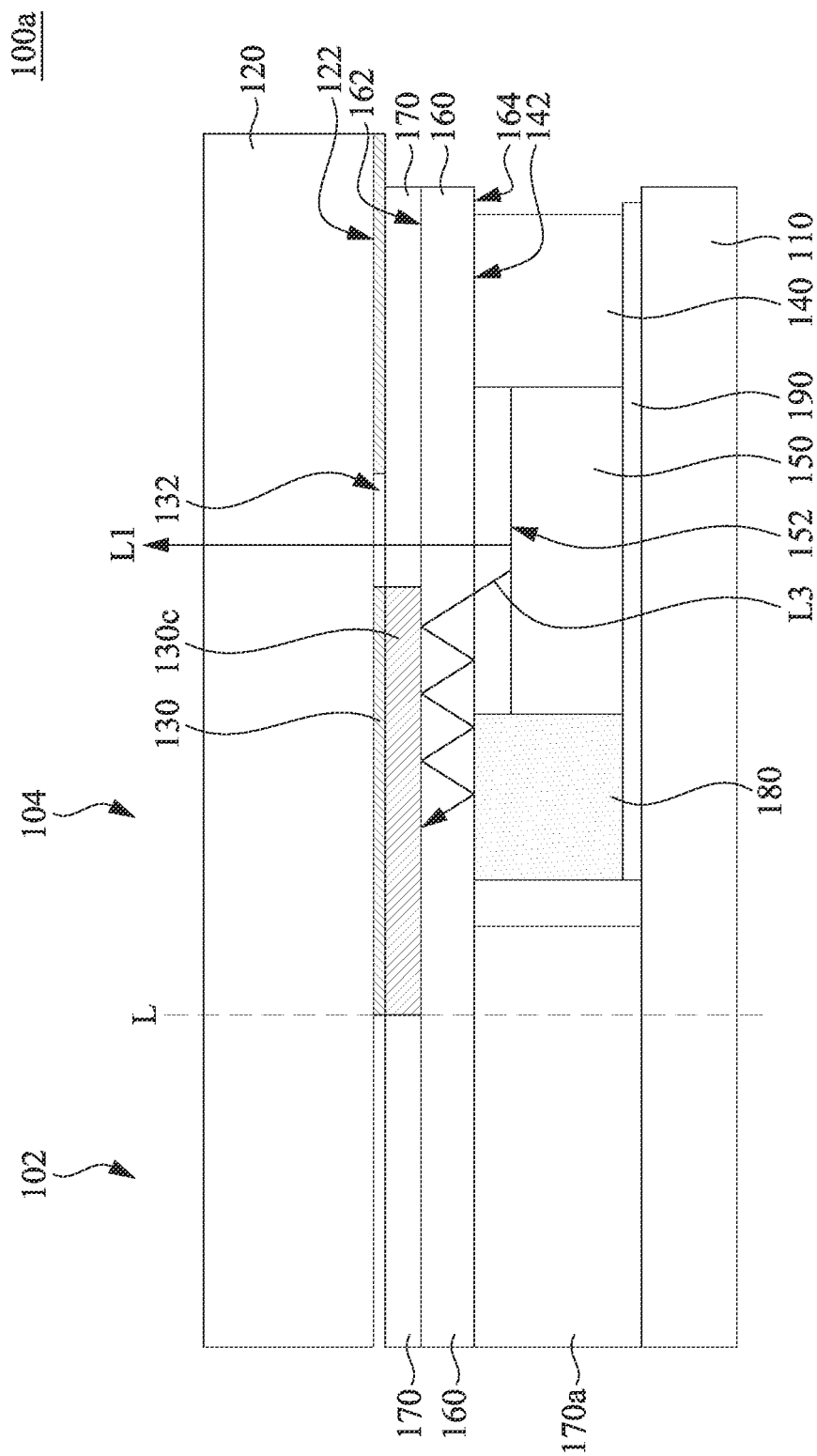
FIG. 5 is a schematic view of light paths when the electronic device of FIG. 4 is in use.

FIG. 4 is a cross-sectional view of an electronic device 100a according to another embodiment of the present disclosure, in which the cross-sectional position of FIG. 4 is the same as that of FIG. 2. FIG. 5 is a schematic view of light paths when the electronic device 100a of FIG. 4 is in use. As shown in FIG. 4 and FIG. 5, the electronic device 100a includes the display module 110, the protection cover 120, the first light shielding layer 130, the light source 140, the light guide plate 150, the touch sensitive film 160, the first optical adhesive 170, the light shielding element 180, and a second light shielding layer 130c. The difference between this embodiment and the embodiment of FIG. 2 is that the second light shielding layer 130c is surrounded by the first optical adhesive 170. In this embodiment, the second light shielding layer 130c is located between the first light shielding layer 130 and the touch sensitive film 160, and the second light shielding layer 130c abuts against the bottom surface of the first light shielding layer 130. In this embodiment, the second light shielding layer 130c may be a black optical clear adhesive or a black tape (e.g., a double-sided tape).

Through the aforementioned configuration, when the light source 140 emits light, the second light shielding layer 130c may prevent the formation of light transmitted in the first optical adhesive 170 (e.g., the light L2 of FIG. 3). In addition, although the touch sensitive film 160 above the light guide plate 150 may laterally transmit the light L3, the light L3 would be absorbed by the second light shielding layer 130c in the non-visible area 104, and would not be transmitted to the visible area 102 of the electronic device 100a. As a result, it can be ensured that the light of the light guide plate 150 is passed through the icon opening 132 of the first light shielding layer 130, and does not enter the visible area 102 and cause the problem of light leakage in the visible area 102, which can improve the product yield and product competitiveness, and is beneficial to user's visual experience.

Moreover, in alternative embodiments, the third light shielding layer 130b of FIG. 2 may be disposed between the touch sensitive film 160 and the light shielding element 180 of the electronic device 100a of FIG. 4.

In the following description, a manufacturing method of an electronic device will be explained.

Figure 6:
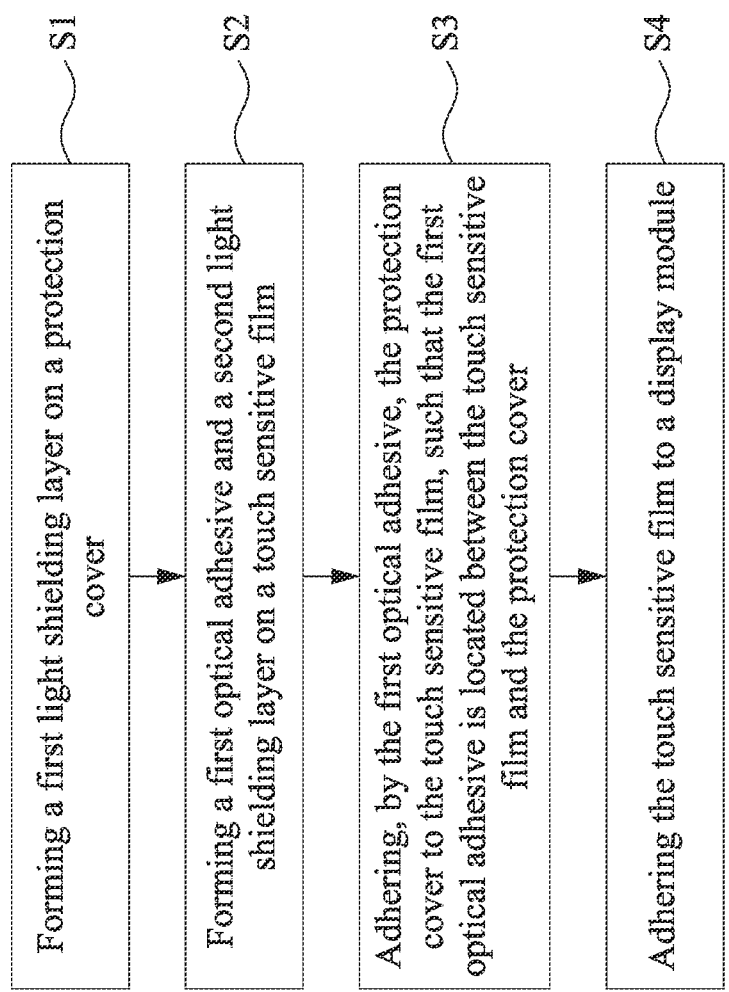
FIG. 6 is a flow chart of a manufacturing method of an electronic device according to one embodiment of the present disclosure.

FIG. 6 is a flow chart of a manufacturing method of an electronic device according to one embodiment of the present disclosure. The manufacturing method of the electronic device in includes the following steps. In step S1, a first light shielding layer is formed on a protection cover. Thereafter, in step S2, a first optical adhesive and a second light shielding layer are formed on a touch sensitive film. Afterwards, in step S3, the protection cover is adhered to the touch sensitive film by the first optical adhesive, such that the first optical adhesive is located between the touch sensitive film and the protection cover. Subsequently, in step S4, the touch sensitive film is adhered to a display module. In some embodiments, the manufacturing method of the electronic device is not limited to the above steps S1 to S4, and can further include for example other steps between two of the above steps, or steps S1 to S4 can each include multiple detailed steps. In the following description, each step of the manufacturing method of the electronic device will be explained.

As shown in FIG. 2, the first light shielding layer 130 may be formed on the protection cover 120. Moreover, the first optical adhesive 170 and the second light shielding layer 130a may be formed on the touch sensitive film 160. In this embodiment, the second light shielding layer 130a may be black ink, and may be printed on the touch sensitive film 160. Thereafter, the first optical adhesive 170 adheres to and covers the second light shielding layer 130a and the touch sensitive film 160. Next, the first optical adhesive 170 is used to adhere the protection cover 120 to the touch sensitive film 160, such that the first optical adhesive 170 is located between the touch sensitive film 160 and the protection cover 120. In the following manufacturing process, the second optical adhesive 170a may be used to adhere the touch sensitive film 160 to the display module 110.

As shown in FIG. 4, the difference between this embodiment and the forming method of the electronic device 100 of FIG. 3 is the forming methods of the first optical adhesive 170 and the second light shielding layer 130c of the electronic device 100a on the touch sensitive film 160. In this embodiment, the second light shielding layer 130c may be a black optical adhesive or a black tape (e.g., a double-sided tape).

When the second light shielding layer 130c is a black optical adhesive, the liquid second light shielding layer 130c may be coated on the touch sensitive film 160, and then the first optical adhesive 170 is coated on the touch sensitive film 160, such that the first optical adhesive 170 is adjacent to the second light shielding layer 130c. After coating is completed, the first optical adhesive 170 and the second light shielding layer 130c may be cured by UV irradiation or heating. In some embodiments, the second light shielding layer 130c may be cured before coating the liquid first optical adhesive 170, and the present disclosure is not limited in this regard.

In another embodiment, when the first optical adhesive 170 is film type and the second light shielding layer 130c is a black optical adhesive, the first optical adhesive 170 may adhere to the touch sensitive film 160, and then the second light shielding layer 130c is coated om the touch sensitive film 160, such that the second light shielding layer 130c is adjacent to the first optical adhesive 170. After coating is completed, the second light shielding layer 130c may be cured by UV irradiation or heating.

In alternative embodiment, when the second light shielding layer 130c is a black tape, the second light shielding layer 130c may adhere to the touch sensitive film 160, and then the first optical adhesive 170 is coated on the touch sensitive film 160, such that the first optical adhesive 170 is adjacent to the second light shielding layer 130c. After coating is completed, the first optical adhesive 170 may be cured by UV irradiation or heating.

Through above steps, the first optical adhesive 170 and the second light shielding layer 130c may be formed on the touch sensitive film 160. Thereafter, the first optical adhesive 170 may be used to adhere the protection cover 120 to the touch sensitive film 160, such that the first optical adhesive 170 is between the touch sensitive film 160 and the protection cover 120. In the following process, the second optical adhesive 170a may be used to adhere the touch sensitive film 160 to the display module 110.

Figure 7:
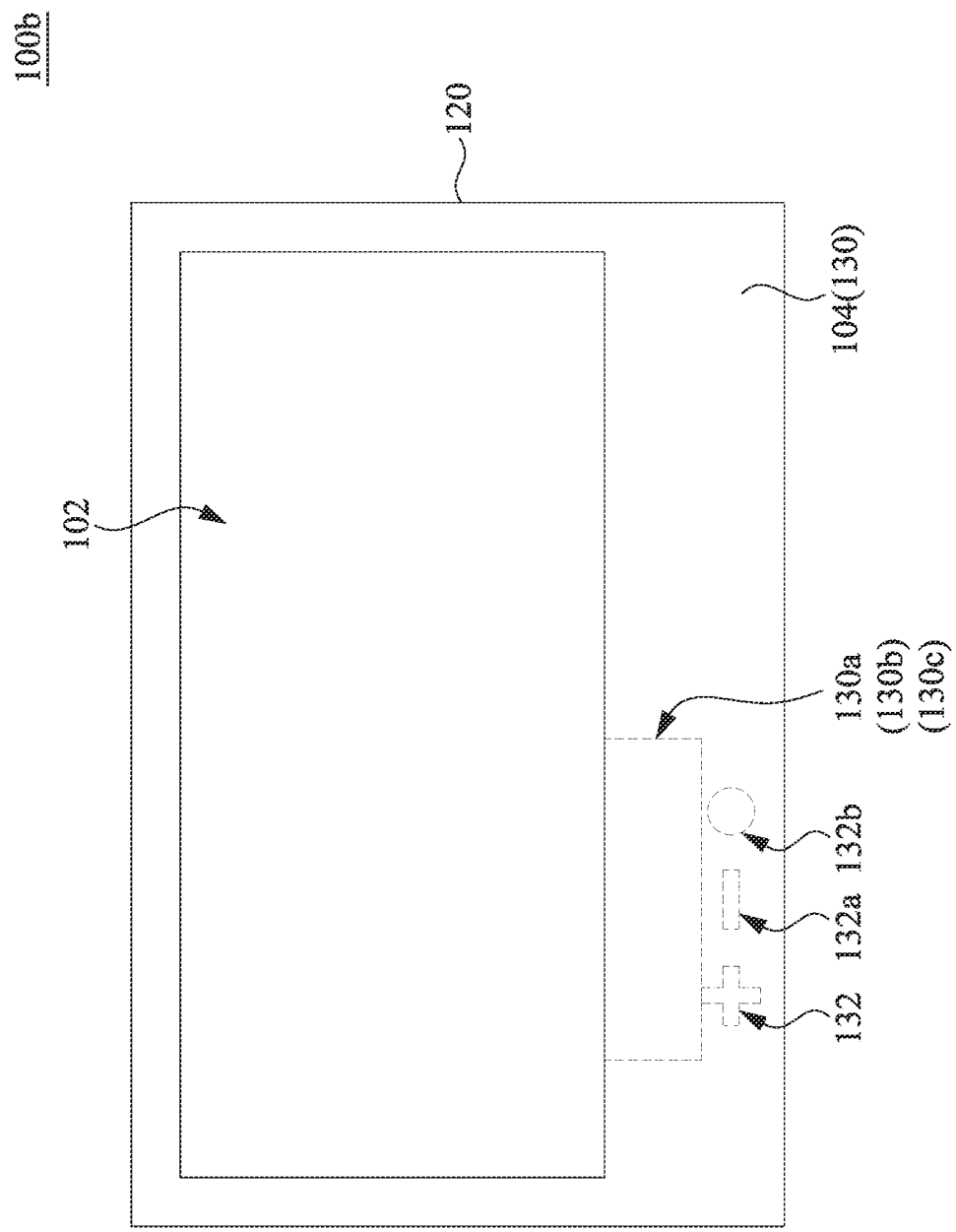
FIG. 7 is a top view of an electronic device according to another embodiment of the present disclosure.

FIG. 7 is a top view of an electronic device 100b according to another embodiment of the present disclosure. The difference between this embodiment and the embodiment of FIG. 1 is that the electronic device 100b further includes icon openings 132a and 132b in addition to the icon opening 132, and the second light shielding layer 130a and the third light shielding layer 130b have a longer length. In this embodiment, the second light shielding layer 130a and the third light shielding layer 130b at least extend from the left side of the icon opening 132 to the right side of the icon opening 132b. As a result, the second light shielding layer 130a and the third light shielding layer 130b are located between any one of the icon openings 132, 132a, and 132b and the visible area 102. In such a design, when one or more of the icon openings 132, 132a, and 132b are lit up, the single second light shielding layer 130a and the single third light shielding layer 130b may be used to absorb light transmitted in the non-visible area 104, thereby saving manufacturing cost and assembling cost.

In addition, the second light shielding layer 130a may be replaced with the second light shielding layer 130c of FIG. 4 according to design requirements, and the present disclosure is not limited in this regard.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
a display module;
a protection cover located above the display module;
a first light shielding layer connecting a bottom surface of the protection cover, and configured to define a non-visible area of the electronic device;
a light guide plate located on the display module and overlapping the non-visible area;
a light source located on the display module and adjacent to the light guide plate;
a touch sensitive film above the light guide plate;
a first optical adhesive located between the touch sensitive film and the protection cover;
a light shielding element located on the display module and overlapping the non-visible area;
a second optical adhesive located between the display module and the touch sensitive file, wherein the light shielding element is located between the second optical adhesive and the light guide plate; and
a second light shielding layer located on the touch sensitive film and overlapping the light shielding element, and configured to absorb light transmitted in the touch sensitive film and the first optical adhesive in the non-visible area.

2. The electronic device of claim 1, wherein the second light shielding layer is located between the first optical adhesive and the touch sensitive film.

3. The electronic device of claim 1, wherein the second light shielding layer is surrounded by the first optical adhesive, and is located between the first light shielding layer and the touch sensitive film.

4. The electronic device of claim 1, further comprising:
a third light shielding layer located in the non-visible area, wherein the touch sensitive film is located between the second light shielding layer and the third light shielding layer.

5. The electronic device of claim 4, wherein the second light shielding layer and the third light shielding layer are respectively located on a top surface and a bottom surface of the touch sensitive film.

6. The electronic device of claim 4, wherein the second light shielding layer at least partially overlaps the third light shielding layer.

7. The electronic device of claim 4, wherein a top surface of the light shielding element abuts against the third light shielding layer.

8. The electronic device of claim 4, wherein a width of the third light shielding layer is substantially the same as a width of the second light shielding layer.

9. The electronic device of claim 1, wherein the light guide plate is located between the light shielding element and the light source.

10. The electronic device of claim 1, wherein the first light shielding layer has an icon opening located above the light guide plate and configured to enable light of the light guide plate to pass through.

11. The electronic device of claim 1, wherein the first optical adhesive is located between the first light shielding layer and the second light shielding layer.

12. The electronic device of claim 1, wherein a top surface of the light shielding element is higher than a top surface of the light guide plate and a top surface of the light source.

13. The electronic device of claim 1, further comprising:
a flexible printed circuit board located on the display module, wherein the light shielding element, the light guide plate, and the light source are located on the flexible printed circuit board.

14. The electronic device of claim 1, wherein a width of the second light shielding layer is greater than a width of the light shielding element.

15. A manufacturing method of an electronic device, comprising:
forming a first light shielding layer on a protection cover;
forming a first optical adhesive and a second light shielding layer on a touch sensitive film;
adhering, by the first optical adhesive, the protection cover to the touch sensitive film, such that the first optical adhesive is located between the touch sensitive film and the protection cover; and
adhering, by a second optical adhesive, the touch sensitive film to a display module, wherein the second optical adhesive is located between the display module and the touch sensitive film, and a light shielding element on the display module is located between the second optical adhesive and a light guide plate on the display module.

* * * * *